United States Patent
Cowley et al.

(10) Patent No.: US 9,054,720 B2
(45) Date of Patent: Jun. 9, 2015

(54) SYSTEM, APPARATUS AND METHOD TO IMPROVE ANALOG-TO-DIGITAL CONVERTER OUTPUT

(75) Inventors: Nicholas P. Cowley, Wroughton (GB); Isaac Ali, Mississauga (CA)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/976,329

(22) PCT Filed: Apr. 19, 2012

(86) PCT No.: PCT/US2012/034237
§ 371 (c)(1), (2), (4) Date: Dec. 6, 2013

(87) PCT Pub. No.: WO2013/158104
PCT Pub. Date: Oct. 24, 2013

(65) Prior Publication Data
US 2014/0091955 A1 Apr. 3, 2014

(51) Int. Cl.
| | |
|---|---|
| H03M 1/06 | (2006.01) |
| H03M 1/08 | (2006.01) |
| H03M 1/10 | (2006.01) |
| H03M 1/00 | (2006.01) |
| H03M 1/12 | (2006.01) |

(52) U.S. Cl.
CPC . *H03M 1/08* (2013.01); *H03M 1/00* (2013.01); *H03M 1/12* (2013.01); *H03M 1/0695* (2013.01); *H03M 1/1028* (2013.01); *H03M 1/1215* (2013.01)

(58) Field of Classification Search
CPC ........ H03M 1/00; H03M 1/12; H03M 1/0695
USPC .......................... 341/118, 120, 155, 156, 161
See application file for complete search history.

(56) References Cited

U.S. PATENT DOCUMENTS

| | | | |
|---|---|---|---|
| 7,084,791 | B2 | 8/2006 | Cesura et al. |
| 8,102,171 | B2 | 1/2012 | Reichel et al. |
| 2007/0069937 | A1 | 3/2007 | Balakrishnan et al. |
| 2007/0171116 | A1 | 7/2007 | Fuse et al. |
| 2010/0085231 | A1* | 4/2010 | Doris ............................. 341/155 |
| 2011/0304489 | A1* | 12/2011 | Christer et al. ................ 341/118 |

OTHER PUBLICATIONS

International Search Report, PCT/ISA/210, Dec. 29, 2012, total of 3 sheets.

* cited by examiner

*Primary Examiner* — Joseph Lauture
(74) *Attorney, Agent, or Firm* — Pillsbury Winthrop Shaw Pittman LLP

(57) ABSTRACT

According to various embodiments, a system, an apparatus and a method are presented that relate to determining and correcting signal imbalances between output samples of an analog-to-digital (A-D) converter array (that may be implemented as part of a wideband ADC). A statistic module and correction module are associated with the A-D converter array. The statistic module is configured to receive digital samples from the plurality of A-D converters, and generate a statistical sample value for each A-D converter using a set of digital samples received therefrom. The correction module is configured to, for at least one of the plurality of A-D converters, determine an offset value by comparing the statistical sample value for the at least one of the plurality of A-D converters with a reference value, and apply the offset value to a digital sample from that at least one A-D converter to generate a corrected digital sample.

33 Claims, 8 Drawing Sheets

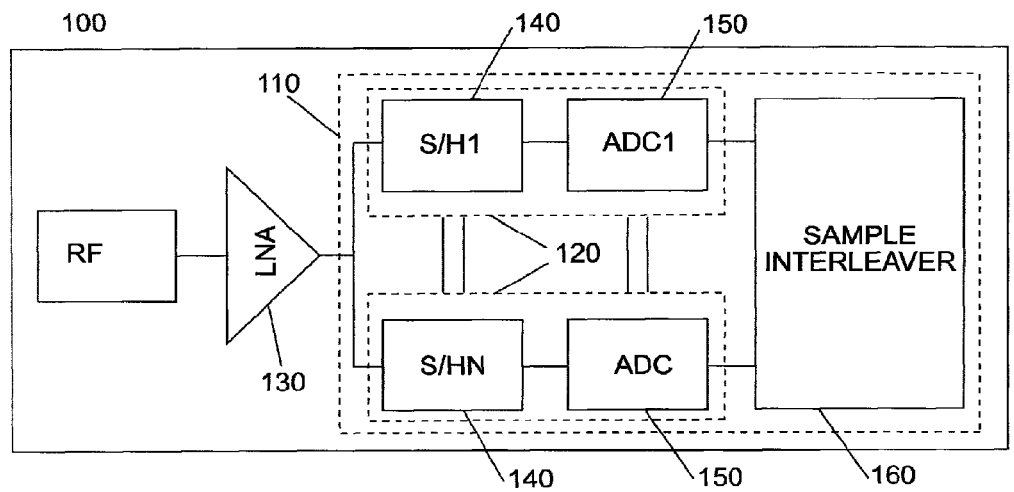
FIGURE 1 - An example interleaved ADC architecture – PRIOR ART
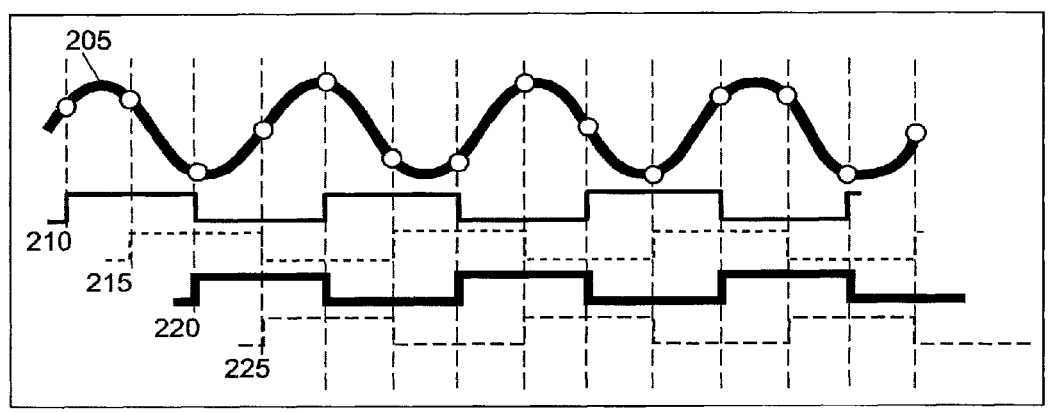
FIGURE 2 - Illustrative 4-segment time interleaving – PRIOR ART

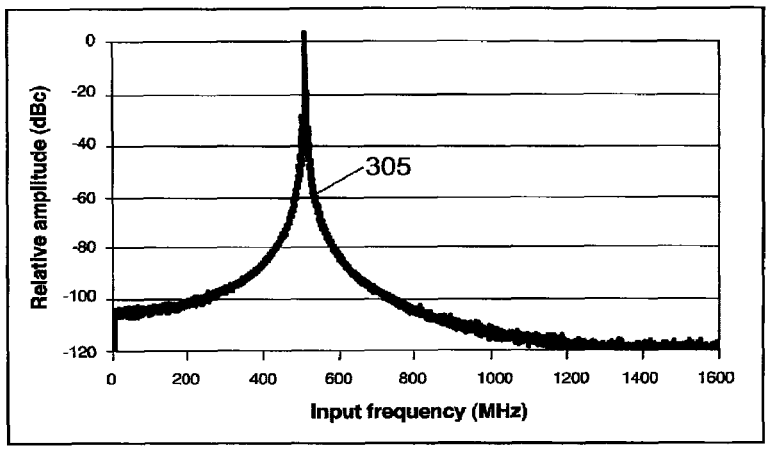
FIGURE 3 - Digitized spectrum with ideal time interleaving
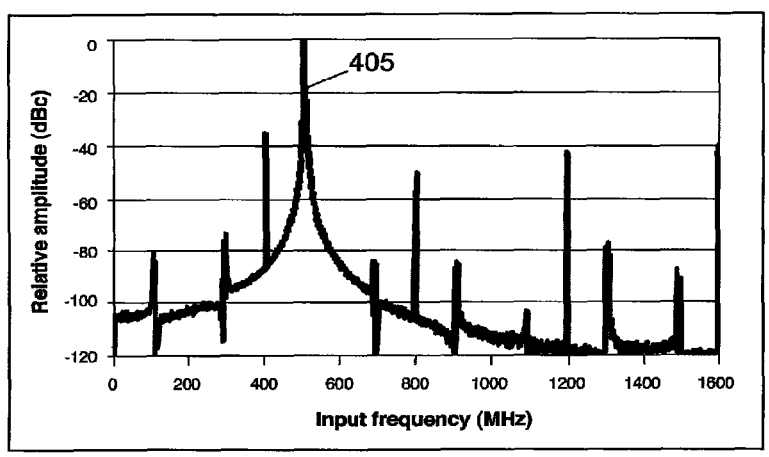
FIGURE 4 - Digitized spectrum with typical time interleaving errors

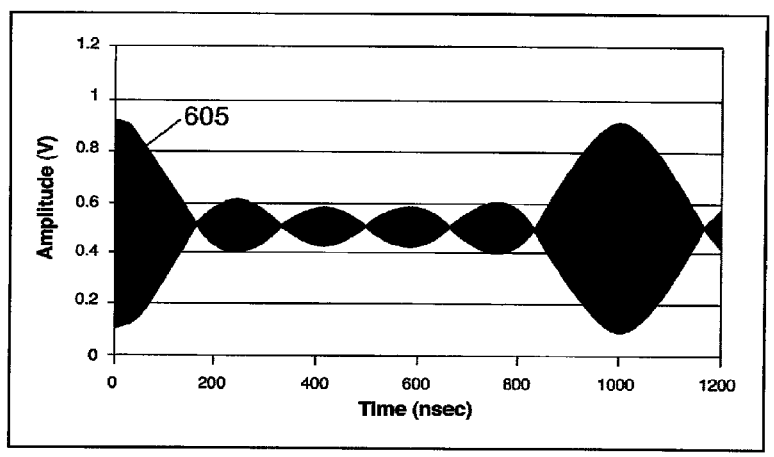
FIGURE 6 – Time domain representation of an example test analog signal

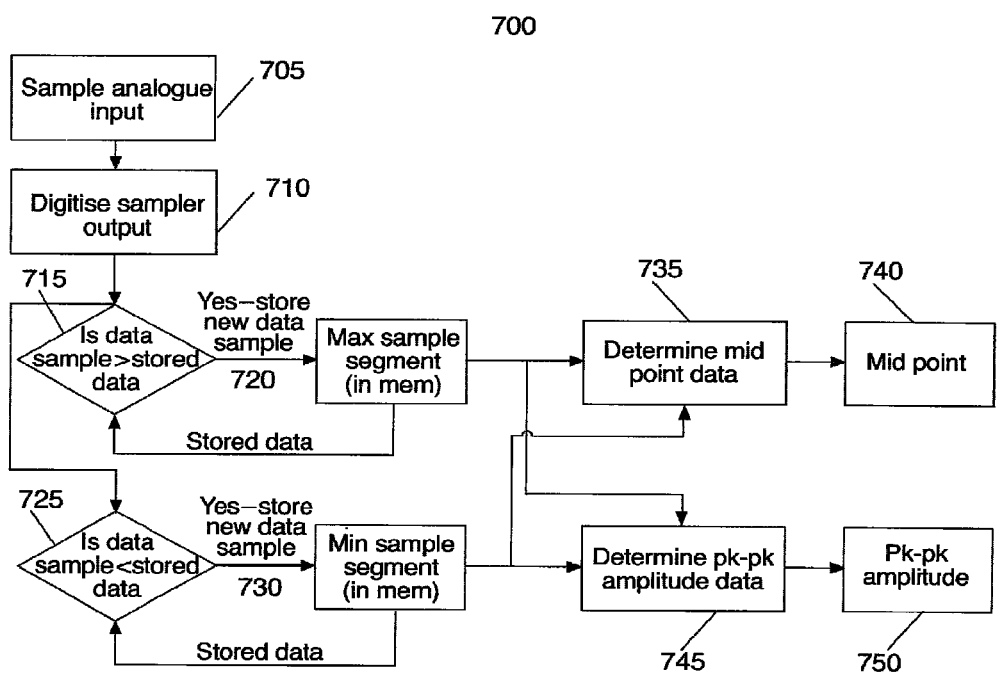
FIGURE 7 - Illustrative flow chart for determining segment statistical (DC and gain) factors

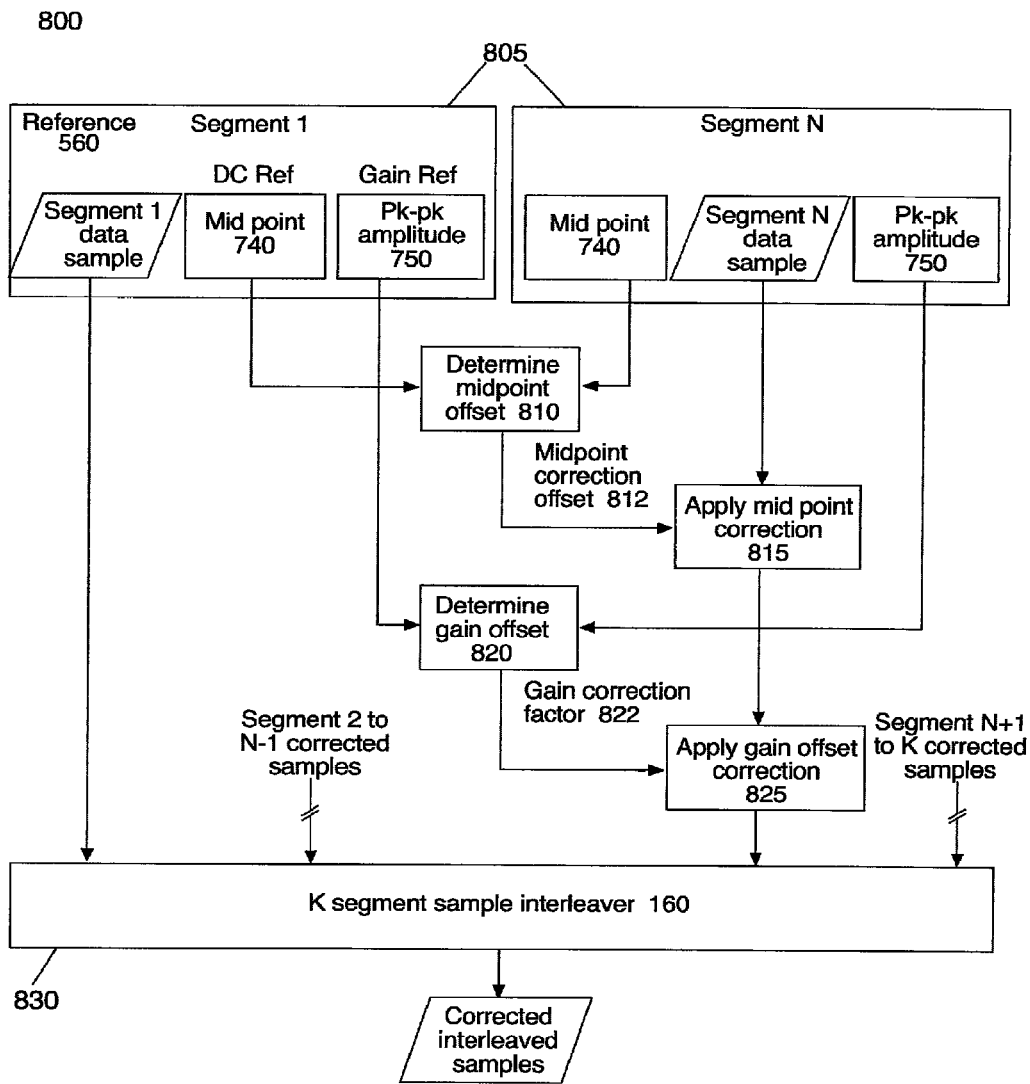
FIGURE 8 - Illustrative flow chart for applying gain and DC offset correction

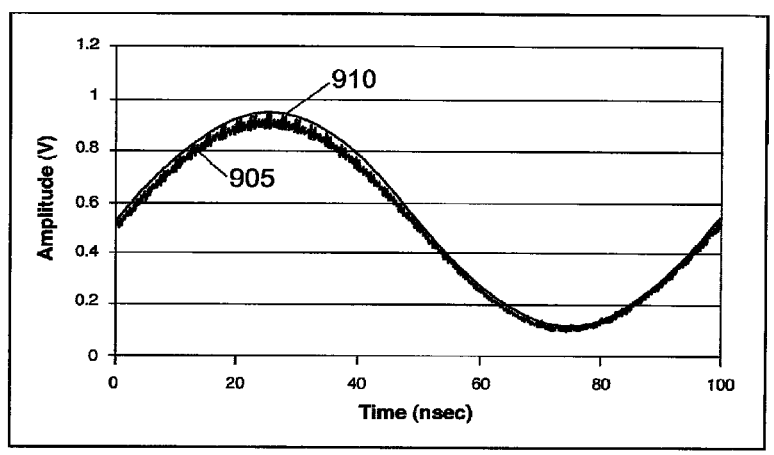
FIGURE 9 - Simulation output comparing a signal with time interleaving errors and with correction algorithm applied

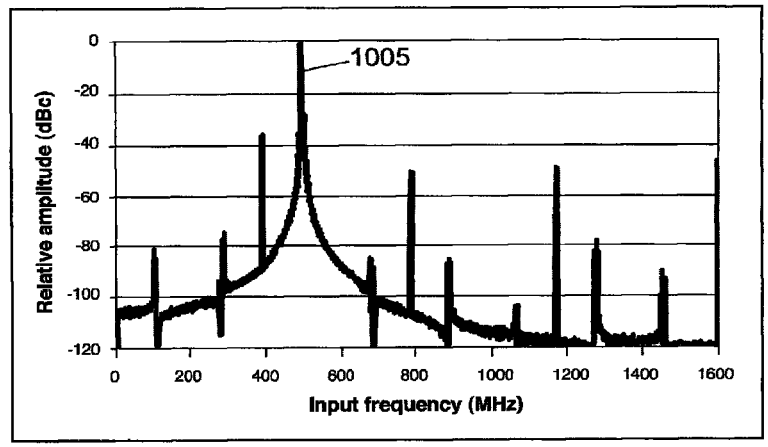
FIGURE 10 - Test signal in frequency domain with time interleaving errors
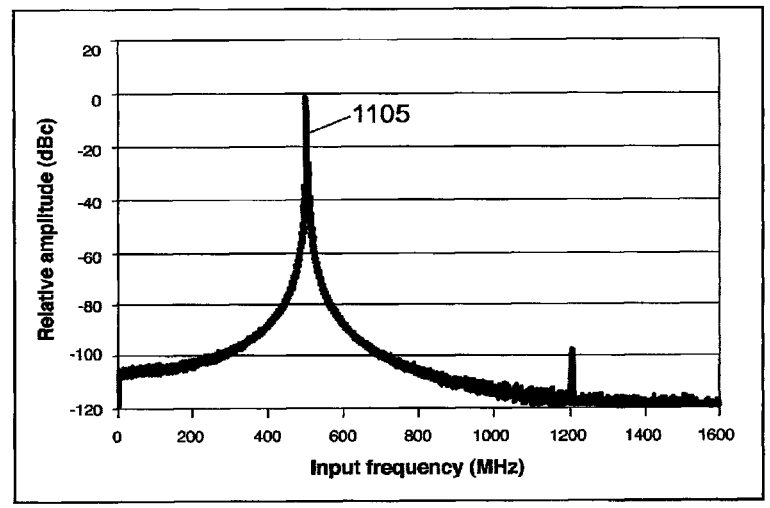
FIGURE 11 - Test signal in frequency domain with time interleaving error after applying correction algorithm

SYSTEM, APPARATUS AND METHOD TO IMPROVE ANALOG-TO-DIGITAL CONVERTER OUTPUT

FIELD

This disclosure relates generally to analog-to-digital (A-D) converters, and more particularly, to detecting and correcting signal imbalance present in output signals of an array of time-interleaved A-D converters associated with a wideband A-D converter.

BACKGROUND

Currently, various applications, e.g., communication receivers and tuners, are being implemented such that they require analog-to-digital (A-D) converters which produce digital output samples or signals with a very high sampling rate and high effective number of bits (ENOB). For example, a receiver system based on the Data Over Cable Service Interface Specification (DOCSIS) standard may be implemented such that there is a need to support reception of up to 8 sets of 8-bonded 6 MHz channels across the operating frequency range of about 54 to 1004 MHz. A traditional approach includes implementing multiple analog tuners, however, such technique may be ineffective in terms of the resultant power and area requirements. Another approach may include implementing a wideband sampling tuner that supports the required operating frequency range.

Such a wideband sampling tuner is effectively a wideband A-D converter which, in this example, may be required to sample at a rate of 3 GS/sec (giga-samples per second), have an input bandwidth of 1 GHz and an ENOB of 10.5 bits minimum. Implementation of such a wideband A-D converter (with the above performance requirements) may be extremely challenging even using latest generation technologies (e.g., deep sub-micron technologies). Accordingly, such wideband high-sampling rate A-D converters are typically implemented as an array of time-interleaved A-D converters each having a lower sampling rate (e.g., a fraction of the sampling rate of the wideband A-D converter).

However, such arrangements that include time-interleaving outputs of an A-D converter array are well known to suffer from signal impairments due to DC (e.g., mean value) and gain (e.g., peak-to-peak value) imbalance between outputs of individual A-D converters of the array. Both DC and gain imbalance typically lead to an error in the sampled level, which in turn may lead to one or more spurious peaks being generated in the frequency domain, referred to as time interleaving errors.

Techniques that attempt to correct for such errors are generally based on running a calibration utility during, e.g., initialization process of the A-D converter array, or applying correction in the analog domain to correct DC and gain imbalance. However, such techniques have the disadvantage that there is no real time correction for calibration drift (e.g., for calibration or correction performed in the digital domain), and may have associated time and/or circuit overheads.

BRIEF DESCRIPTION OF THE DRAWINGS

FIG. 1 is a block diagram of a system including a typical time-interleaved A-D converter.
FIG. 2 illustrates a signal diagram related to a typical 4-segment time-interleaved A-D converter.
FIG. 3 illustrates frequency-domain performance of a typical time-interleaved A-D converter under ideal conditions.
FIG. 4 illustrates frequency-domain performance of a typical time-interleaved A-D converter under practical conditions (i.e., with various errors).
FIG. 6 presents a time-domain representation of an example test analog signal.
FIG. 7 is a flow chart illustrating a method according to various embodiments of the present disclosure.
FIG. 8 is a flow chart illustrating a method according to various embodiments of the present disclosure.
FIG. 9 illustrates time-domain performance of a time-interleaved A-D converter according to various embodiments of the present disclosure.
FIGS. 10 and 11 illustrate frequency-domain performance of a time-interleaved A-D converter according to various embodiments of the present disclosure.

DETAILED DESCRIPTION

Figure 5:
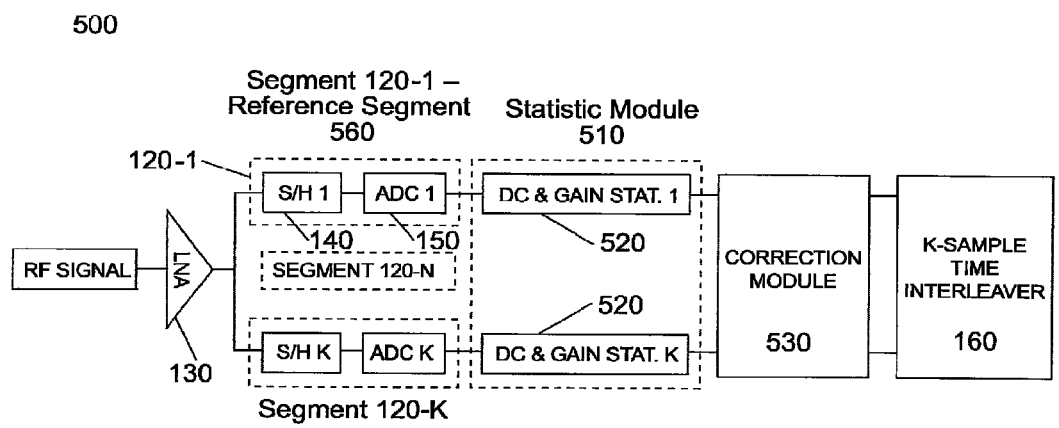
FIG. 5 is a block diagram of a system including a time-interleaved A-D converter, in accordance with various embodiments of the present disclosure.

In the description that follows, like components have been given the same reference numerals, regardless of whether they are shown in different aspects. To illustrate one or more aspect(s) of the present disclosure in a clear and concise manner, the drawings may not necessarily be to scale and certain features may be shown in somewhat schematic form. Features that are described and/or illustrated with respect to one aspect may be used in the same way or in a similar way in one or more other aspects and/or in combination with or instead of the features of the other aspects of the technology disclosed herein.

In accordance with various embodiments of the present disclosure, in order to address any imbalance between output digital samples generated by an array of (time-interleaved) A-D converters, e.g., that are associated with a wideband A-D converter, a set of samples of each A-D converter (of the array) are processed (e.g., in real time) to generate a statistic sample value (e.g., an average value, a maximum value, etc.) associated with that A-D converter. Further, to correct for one or more signal imbalances in output samples of at least one of the A-D converters, the generated statistic sample value of that A-D converter is compared with a reference value to obtain a correction offset value, e.g., in real time. Further, in real time, the offset value is then applied to one or more output digital samples of that A-D converter, thereby generating corrected digital samples. The above technique of correcting output samples (by generating and applying offset value) may be performed for each A-D converter of the A-D converter array using the corresponding statistic sample value.

In broad overview, the apparatus, system and method in accordance with various embodiments of the present disclosure may be implemented in connection with (or as part of) communication receiver or tuner systems. By way of illustration, such receivers and/or tuner systems may be employed in any number of communication-enabled devices, such as, servers, desktop computers, laptops, mobile devices, smartphones, gaming devices, tablet computing devices, networking devices, etc. Along these lines, the disclosed embodiments may be implemented in association with one or more A-D converters of wideband receivers configured to receive wireless radio frequency signals or signals over a cable (or other wireline mediums). Such receivers may be configured to operate based on DOCSIS standard, any standard associated with personal area networks, and/or other communication standards.

In accordance with various embodiments of the present disclosure, an apparatus to determine and correct signal imbalances between output samples of an A-D converter array (that may be implemented as part of a wideband ADC) is presented. The apparatus may include a plurality of A-D converters, a statistic module, a correction module, and a sample interleaver. Each of the plurality of A-D converters may be configured to process an input analog signal and generate digital samples.

The statistic module may be configured to receive the digital samples from each of the A-D converters, and generate a statistical sample value associated with each A-D converter using a set of digital samples received therefrom. The statistic module may include a set or plurality of dedicated statistic modules, each dedicated statistic module being configured to receive digital samples from one of the plurality of A-D converters, and generate the statistical sample value for the corresponding A-D converter. The generated statistical sample value may include one or more of an average or mean of the sample values of the sample set, a maximum sample value of the sample set, or a peak-to-peak value (i.e., difference between the maximum and minimum value) of the sample set, and/or other statistical quantities of the sample set.

The correction module may be configured to, for at least one (or each) of the plurality of A-D converters, determine an offset value by comparing the generated statistical sample value for that A-D converter with a reference value. The reference value may be the generated statistical sample value for (randomly-selected) one of the A-D converters other than the one for which the offset value is being computed. Alternatively, the reference value may be the maximum (or minimum) statistical value from the generated statistical values of all of the A-D converters, or may be a predetermined value unassociated with the generated statistical values. The correction module may be further configured to apply the offset value to one or more digital samples received from the A-D converter (for which the offset value was computed) to generate corrected digital samples.

The sample interleaver may be configured to perform time-interleaving on the digital samples produced by the plurality of A-D converters to generate a (desired) high sample rate digital output. Such time-interleaving may be performed before or after the digital samples have been corrected by the correction module.

In accordance with various embodiments of the present disclosure, a method to determine and correct signal imbalances between output samples of an A-D converter array (that may be implemented as part of a wideband ADC) is presented. The method may include generating a statistical sample value for each of a plurality of A-D converters using a set of digital samples received therefrom. The generated statistical sample value may include one or more of an average or mean of the sample values of the sample set, a maximum sample value of the sample set, or a peak-to-peak value of the sample set and/or other statistical quantities of the sample set.

The method may further include determining an offset value comprising comparing the statistical sample value of at least one (or each) of the plurality of A-D converters with a reference value, and applying the offset value to one or more digital samples received from that A-D converter to generate corrected digital samples. The reference value may be the generated statistical sample value for (randomly-selected) one of the A-D converters other than the one for which the offset value is being computed, the maximum (or minimum) statistical value from the generated statistical values of all of the A-D converters, or a predetermined value unassociated with the generated statistical values.

The method may further include time-interleaving the digital samples produced by the plurality of A-D converters to generate a (desired) high sample rate digital output. Such high sample rate output has the sample rate which is equal to the sample rate of an individual A-D converter of the array multiplied by the number of A-D converters in the array. Such time-interleaving may be performed before or after the digital samples have been corrected using the offset value.

In accordance with various embodiments of the present disclosure, a system to correct signal imbalances between output samples of an A-D converter array is presented. The system comprises, a plurality of A-D converters, one or more processing units, and a sample time-interleaver. Each A-D converter may be configured to generate digital samples, and provide the samples to the processing unit. The processing unit, upon receipt of the digital samples from the A-D converters generate a statistical sample value, for each of the plurality of A-D converters, using a set of digital samples from the digital samples received from that A-D converter. The processing unit may then, for at least one of the A-D converters, determine an offset value, e.g., by comparing the statistical sample value for that particular A-D converter with a reference value. Further, the processing unit may apply the offset value to a digital sample received from that particular A-D converter to generate a corrected digital sample. The sample interleaver may temporally interleave (i.e., perform time interleaving on) the digital samples received from the A-D converters. The sample interleaver may be configured to perform the time interleaving before or after correcting one or more digital samples from one or more A-D converters.

These and other features and characteristics, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various Figures. It is to be expressly understood, however, that the drawings are for the purpose of illustration and description only and are not intended as a definition of the limits of claims. As used in the specification and in the claims, the singular form of "a", "an", and "the" include plural referents unless the context clearly dictates otherwise.

Turning now to the various aspects of the disclosure, FIG. 1 depicts an example of a system 100 including a typical wideband high-sample rate A-D converter 110 implemented using an array of low-sample-rate time-interleaved A-D converter segments 120 (e.g., N segments 120, where N is a positive integer greater than 1). In such a time-interleaved A-D converter array implementation, digital samples from all A-D converter segments 120 are eventually composited in a temporal interleaved fashion, such that the composited digital output has a sampling rate equal to N times the sampling rate of each segment 120, and samples of each segment 120 are temporally-spread within the composited output such that every $N^{th}$ sample in the composited output is a sample from a particular one (and same) segment 120.

In this example, A-D converter 110 does not include capabilities to detect and/or correct signal impairments in output samples from A-D converter segments 120, e.g., due to DC and/or gain imbalance between segments 120. As shown, system 100 may include a low noise amplifier (LNA) 130, sample-and-hold (S/H) modules 140, low-sample-rate A-D converters 150, and a time interleaver module 160.

LNA 130 is configured to amplify the analog input signal (e.g., radio frequency signal) received at system 100, and pass the amplified signal, in parallel (and simultaneously), to each of N A-D converter segments 120. Each A-D converter segment 120 includes a S/H module 140 and an A-D converter 150. S/H modules, e.g., S/H modules 140, are typically configured to sample the analog signal received from LNA 130, and holds (or locks or freezes) the sampled signal value at a constant level for a specified minimal period of time (e.g., in accordance with the sampling rate of the associated A-D converter 150). S/H modules are typically used with A-D converters to eliminate variations in input signal that can corrupt the analog-to-digital conversion process. A typical S/H module stores electric charge in a capacitor, and includes at least one fast FET switch and/or other types of transistors to be used as a switch. Such S/H module may further include at least one operational amplifier. In some embodiments, N S/H modules 140 are preceded by a S/H module (not shown) which is configured to sample the analog signal from LNA 130 at a sampling rate that is N times the sampling rate of each S/H module 140. Typically, such additional S/H module is used to improve timing mismatch which may exist between S/H modules 140.

A-D converter 150, like a typical A-D converter, is configured to process the sampled analog signal from the corresponding S/H module 140, and digitize that analog signal to generate digital samples. The digital samples are usually represented as digital numbers (proportional to the magnitude of the voltage or current of the analog signal) that are coded using one of different coding schemes. Typically, the digital output samples are coded using a two's complement binary coding scheme, but other schemes, such as, Gray coding schemes may be used. The digital samples from each of N A-D converters 150 are provided to time interleaver module 160 to combine the N sample streams, and generate a time-interleaved digital sample stream having sampling rate N times the sampling rate of individual sample streams from A-D converters 150. For example, samples of each segment 120 are temporally-spread within the time-interleaved digital sample output such that every $N^{th}$ sample in the output is a sample from a particular one (and same) segment 120.

An example of time-interleaved sampling for four segments 120 (each having a S/H module 140 and a A/D converter 150) is shown in FIG. 2. As shown, analog signal 205 is sampled and digitized by each of four segments 120 to generate digital outputs 210, 215, 220 and 225. To achieve a higher sampling rate as a result of time-interleaving these digital outputs, as shown, the sampling clocks of each S/H modules 140 may be arranged appropriately, e.g., as shown in FIG. 2, with a phase offset of 90 degrees between segments 120 (that basically result in offsetting the beginning of the sampling by each S/H module 140). Digital outputs 210, 215, 220 and 225 are combined, e.g., by interleaver module 160 to generate a digital output having a sample rate of four times the segment sample rate.

A typical time-interleaved A-D converter implementation, e.g., as shown in FIG. 1 and discussed above, suffers from signal impairments due to DC (e.g., mean value) and gain (e.g., peak-to-peak value) imbalance between outputs of individual A-D converter segments (e.g., segments 120). Both DC and gain imbalance typically lead to an error in the sampled level of the digital output, e.g., obtained from the interleaver, which in turn may lead to one or more spurious peaks being generated in the frequency domain of the digital output signal.

FIGS. 3 and 4 illustrate amplitude profiles of the spectrum of a signal obtained via simulation of an 8-segment 10-bit time-interleaved A-D converter having a final sampling rate of 3.2 GS/s (giga-samples per second) without and with gain and DC imbalance. The simulated 8-segment 10-bit A-D converter may be based on the implementation discussed above with regard to FIG. 1. FIG. 3 relates to an "ideal" operation of the A-D converter on an input signal with input spectrum containing 6 channels at 1 MHz spacing at about 500 MHz frequency. In this example, the ideal operation relates to an A-D converter output having no gain or DC imbalance. As a result of such ideal operation, as shown in FIG. 3, amplitude profile curve 305 only has peak(s) corresponding to the input signal frequencies around 500 MHz, and has no other spurious peaks. FIG. 4 illustrates an amplitude profile curve 405 of an output obtained as a result of simulating the operation of the 8-segment A-D converter with up to 3% randomly-distributed segment imbalance. As can be seen, profile 405 has significant spurious peaks generated by the time interleaving errors, in addition to the amplitude peak corresponding to the input signal frequencies around 500 MHz.

Turning now to FIG. 5 which illustrates an example of a system 500 including a wideband high-sample rate time-interleaved A-D converter, e.g., ADC 110, to digitize an analog signal, e.g., signal 605 shown in FIG. 6. Signal 605 illustrates a complex test waveform applied in the time domain consisting of 6 carriers at 500 MHz frequency with 1 MHz spacing. System 500 includes DC and gain imbalance correction capabilities, in accordance with various embodiments of this disclosure. In general, in system 500, unlike typical ADC-related time-interleaving error correction techniques, DC and gain imbalance correction is applied in the digital domain and in real time (compensating any time-dependent variation in ADC segment matching).

As shown, in some embodiments, system 500 includes LNA 130, K A-D converter segments 120 (where K is a positive integer greater than 1), a statistic module 510 (including dedicated statistic modules 520), a correction module 530, and time interleaver module 160. Each of K segments 120 includes a sample-and-hold (S/H) module 140, and an A-D converter 150. Although an individual S/H module 140 is shown for each segment 120, there may be only one common S/H module for segments 120 with a demultiplexer to each individual segment 120. Generally, in system 500, samples from each segment 120 are analyzed, e.g., using statistic module 510, and the analyzed data is used, e.g., by correction module 530, to determine correction factors corresponding to the gain and/or DC imbalance of each segment 120 relative to a reference value. Although only one correction module 530 is shown, it is for illustrative purposes only. There may be more than one correction module that may be multiplexed between one or more segments 120. Further, with respect to system 500, it is assumed that, since the spectrum of the input analog signal may contain multiple (e.g., up to 160) uncorrelated channels each with pseudo-random modulation, the samples for each segment (e.g., segment 120) will have the substantially same power density distribution as of the input signal.

In operation, for imbalance correction, digital samples from each A-D converter 150 are provided to statistic module 510. For example, each dedicated statistic module 520 may be configured to receive digital samples from one of A-D converters 150. As such, each dedicated statistic module 520 may be configured to compute a statistical sample value for the corresponding A-D converter 150 using a set of samples received therefrom. The generated statistical sample value may include an average or mean sample value (of the sample set), a maximum or peak-to-peak sample value, and/or other statistical quantities of the sample set.

FIG. 7 is a flow diagram illustrating a method 700 performed, e.g., within system 500 in association with statistic module 510 (or each dedicated statistic module 520) to obtain one or more statistical sample values for a finite sample set, in accordance with various embodiments disclosed herein. For example, for each segment 120, method 700 may commence at operation 705 with sampling the analog signal (e.g., obtained after amplifying signal 605 using LNA 130) by S/H module 140 of that segment. The sampled signal may then be digitized, in operation 710, by A-D converter 150 of that segment to obtain a digital sample. The value of the digital sample is then compared with a stored sample value for that segment (e.g., stored in memory (not shown) of system 500). For example, in operation 715, it is determined by statistic module 520 (corresponding to that segment) whether the value of the digital sample is greater than the stored sample value. If the digital sample value is greater, in operation 720, statistic module 520 stores the digital sample value in the memory as the maximum sample value for that segment. Similarly, in operations 725 and 730, statistic module 520 determines whether the value of the digital sample is less than the stored sample value, and if yes, statistic module 520 stores the digital sample value in the memory as the minimum sample value for that segment. Statistic module 520 may be configured to repeat operations 705-730 for a finite set of samples (e.g., 100 samples, 1000 samples, etc.) to obtain the maximum and minimum sample value of that finite sample set.

Further, in operation 735, statistic module 520 may be configured to obtain the maximum and minimum sample values from the memory to determine an average or mean (or mid or "DC") sample value 740 using the maximum and minimum sample values (and store it back in the memory). And, in operation 745, statistic module 520 may be configured to compute a peak-to-peak (or "gain") sample value 750, e.g., by computing the difference between the maximum and minimum sample values, and store in the memory. Accordingly, each dedicated statistic module 520 (of statistic module 510) computes (and stores) two statistical values, i.e., DC and gain values, for the corresponding segment 120 (or A-D converter 150). However, one or more dedicated statistic modules 520, in general, statistic module 510, may be configured to determine various different statistical values (e.g., median, variance, standard deviation, and/or other statistical quantities) for one or more segments 120.

In some embodiments, the number of samples in the finite set used by statistic module 510 or 520 is configurable in real time, or is a predetermined number based on an application of system 500 and remains fixed during the system operation. In other embodiments, the finite sample set may be a "rolling" sample set, such that if the sample set is defined to have P samples (where P is a positive integer), upon generating or receiving $(P+1)^{th}$ sample, the first sample (or any other one particular sample) in that sample set is dropped to accommodate the $(P+1)^{th}$ sample, thus keeping the total number of samples in the sample set equal to P. Accordingly, statistic module 520 may be configured to repeat operations 705-730 for the latest P samples in the rolling sample set to obtain the maximum and minimum sample value of that sample set. In yet other embodiments, the sample count may be repeated at a rate of less than 1/(number of samples counted), where the count starts from a predetermined value for the maximum and minimum values, which may be zero. One or more of the above techniques to define the sample set may be used so that any long term variation in the input amplitude may be tracked within the statistical data thus obtained.

Statistical sample values (e.g., DC and gain values) for each segment 120 are then passed from statistic module 510 to correction module 530. In some embodiments, correction module 530 is configured to, for each A-D converter segment 120, determine an offset value by comparing the statistical sample value (of that segment) with a reference value, and use the offset value to correct an imbalance in the output samples of that A-D segment 120. The reference value(s) may be the generated statistical sample value(s) of a randomly-selected A-D converter segment 120 (e.g., reference segment 560). Alternatively, the reference value(s) may be the maximum (or minimum) statistical value(s) from the generated statistical values of all A-D converter segments 120, or may be a predetermined value unassociated with the generated statistical values. FIG. 8 is a flow diagram illustrating a method 800 performed, e.g., within system 500 in association with correction module 530 to apply imbalance correction in the output samples of one or more segments 120, in accordance with various embodiments disclosed herein. In method 800, it is assumed that segment 120-1 is the reference segment 560, and therefore, the statistical sample values (i.e., DC 740 and gain 750 values) computed for segment 120-1 are used as reference values (i.e., "DC ref" and "Gain ref") in correction module 530. However, as discussed above, other reference segments and/or reference values may be selected or determined.

Method 800 may commence at operation 805, in which correction module 530 may receive the reference values, DC ref and Gain ref, of the reference segment, e.g., from the memory. In addition, correction module 530 may also receive data samples generated by reference segment 560. Similarly, correction module 530 may also receive to-be-corrected data samples, DC (or average) sample value 740 and gain (or peak-to-peak) sample value 750 for segment 120-N, where N denotes a number from the range including and between 2 and K (in other words, segment 120-N is one of the K A-D segments 120 other than the reference segment).

Further, in operation 810, correction module 530 may compare DC ref with DC sample value 740 of segment 120-N to obtain a DC correction offset value 812. For example, correction module 530 may be configured to compute the DC offset 812 by subtracting DC sample value 740 from DC ref. In operation 815, correction module 530 performs DC correction by applying the DC offset 812 to a data sample of segment 120-N. For example, correction module 530 may add DC offset 812 to the data sample value to normalize segment 120-N sample DC value with the reference value (i.e., DC ref).

In operation 820, correction module 530 may compare Gain ref with gain value 750 of segment 120-N to obtain a gain correction offset value 822. In operation 825, correction module 530 applies gain correction by normalizing the DC-corrected data sample (from operation 815) with gain correction offset 822, and thereby generate a DC-and-gain corrected data sample of segment 120-N.

The above operations 805-825 may be repeated to correct (or normalize) data samples of one or more of the rest of the segments 120 (other than the reference segment). In operation 830, data samples from the reference segment and (DC-and-gain) corrected data samples from other segments 120-2 to 120-K are provided to sample interleaver 160. Interleaver 160 may be configured to perform time-interleaving on the digital samples provided thereto, and generate a high-sample-rate digital sample output with corrected samples. Such time-interleaving (using interleaver 160) may be performed before (instead of after, as shown) the digital samples have been corrected by correction module 530.

FIGS. 9-11 illustrate results obtained from simulations performed for the above-described methods 700, 800. The simulations have been performed for a time-interleaved A-D converter having eight segments, effective sampling rate of 3.2-GS/s, and 10-bit ENOB, with a random mismatch or imbalance of up to 5% applied thereto. In the simulations, the finite sample set used to compute statistical values included 4096 samples, although more or less samples may be used. Referring to FIG. 9, curve 905 illustrates the performance of the time-interleaved A-D converter for a 10 MHz sine wave signal without any (DC or gain) imbalance correction technique applied. As shown, the unsmoothness of curve 905 indicates that the reconstructed analog signal (obtained after converting the digital output of the A-D converter to analog) contains time-interleaving errors (e.g., due to DC and gain imbalance between the segments). Curve 910 illustrates the performance of the A-D converter for the same sine wave signal with the DC-and-gain correction techniques (discussed above) being implemented in the A-D converter. As shown, the reconstructed analog signal indicates that the time-interleaving errors have been corrected.

FIGS. 10 and 11 present curves 1005 and 1105, respectively, representing amplitude profiles (of the A-D converter) in the frequency domain, without and with the correction techniques disclosed herein being applied. As shown, curve 1005 includes spurious peaks indicating time-interleaving errors in the output, whereas such spurious peaks being substantially absent from curve 1105 indicates correction of such errors using the correction techniques.

For clarity, resources and/or components of systems 100, 500 not required or related to techniques or processes of analog-to-digital conversion are not shown in FIGS. 1, 5. However, those resources, components and/or modules (and functions performed by them) will be appreciated by a person of ordinary skill in the art as being part of those systems. Also, one or more modules or components of system 100 or system 500 (e.g., statistic modules 510, 520, correction module 530, etc.), or other components that another system module or component may be connected with (not shown in figures) may include one or more processors and/or individual memory modules, to perform the functions and processes described herein. Although the modules in FIGS. 1 and 5 are shown as individual components or elements, in one or more embodiments, those modules may be combined into one or more devices, one or more software programs, or one or more circuits on one or more chips. In some embodiments, some modules or components of system 100 or system 500 may be part of a system which is located geographically remotely from the rest of the modules or components of that system. In such a case, the remotely located groups of modules may be operatively connected with each other through a wired or wireless network (not shown) using necessary interfaces and components. Such network may include one or more of a private TCP/IP network, the Internet, or a private or public radio frequency (RF) network.

In some embodiments, one or more modules of system 100 or system 500 (e.g., statistic modules 510, 520, correction module 530, etc.) are realized in one or more programmable devices such as a general purpose microprocessor, a digital signal processor (DSP), a reduced instruction set computer (RISC), a complex instruction set computer (CISC), a field programmable gate array (FPGA), an application specific integrated circuit (ASIC), and/or others, including combinations of the above. Alternatively, or additionally, one or more system modules may be implemented in software stored on an article of manufacture (e.g., floppy disks, CDs, hard disks, flash drives, etc.) to enable a general-purpose processor to perform the specific functions described herein, or combination of hardware and software. The processors or controllers described herein may be one or more microprocessors or microcontrollers such as those made by Intel Corporation of Santa Clara, Calif. (although other vendors may be used). In one example, the processors or controllers may form a compute complex on a circuit board and may include one or more microprocessor units, or any other combination of logic circuits capable of executing the functionality and methodologies of, e.g., time-interleaved and imbalance-corrected analog-to-digital conversion. Moreover, such combination of microprocessor units and logic circuitry may be implemented as separate components or may be integrated on to a single platform.

In some embodiments, one or more memory modules within systems 100, 500 are of one or more of the following types of memory: Static random access memory (SRAM), Burst SRAM or SynchBurst SRAM (BSRAM), Dynamic random access memory (DRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (BEDO DRAM), Enhanced DRAM (EDRAM), synchronous DRAM (SDRAM), JEDECSRAM, PCIOO SDRAM, Double Data Rate SDRAM (DDR SDRAM), Enhanced SDRAM (ESDRAM), SyncLink DRAM (SLDRAM), Direct Rambus DRAM (DRDRAM), Ferroelectric RAM (FRAM), or any other type of memory device.

Various embodiments herein are described as including a particular feature, structure, or characteristic, but every aspect or embodiment may not necessarily include the particular feature, structure, or characteristic. Further, when a particular feature, structure, or characteristic is described in connection with an embodiment, it will be understood that such feature, structure, or characteristic may be included in connection with other embodiments, whether or not explicitly described. Thus, various changes and modifications may be made to this disclosure without departing from the scope or spirit of the inventive concept described herein. As such, the specification and drawings should be regarded as examples only, and the scope of the inventive concept to be determined solely by the appended claims.

What is claimed is:

1. An apparatus comprising:
    a statistic module configured to receive digital samples from a plurality of analog-to-digital (A-D) converters, and generate a statistical sample value for each of the plurality of A-D converters using a set of digital samples received therefrom; and
    a correction module configured to, for at least one of the plurality of A-D converters:
        determine an offset value by comparing the statistical sample value for the at least one of the plurality of A-D converters with a reference value, and
        apply the offset value to a digital sample received from the at least one of the plurality of A-D converters to generate a corrected digital sample.

2. The apparatus of claim 1, further comprising a plurality of A-D converters, each A-D converter being configured to generate the digital samples.

3. The apparatus of claim 1, wherein the statistic module comprises a plurality of dedicated statistic modules, each dedicated statistic module being configured to receive digital samples from one of the plurality of A-D converters, and generate the statistical sample value for the corresponding A-D converter.

4. The apparatus of claim 1, wherein the statistical sample value comprises a mean sample value of the set of digital samples.

5. The apparatus of claim 1, wherein the statistical sample value comprises a maximum sample value of the set of digital samples.

6. The apparatus of claim 5, wherein the maximum sample value comprises a peak-to-peak maximum sample value.

7. The apparatus of claim 1, further comprising a sample interleaver configured to time-interleave the digital samples received from the plurality of A-D converters.

8. The apparatus of claim 7, wherein the digital samples time-interleaved by the sample interleaver comprise the corrected digital sample corresponding to the at least one of the plurality of A-D converters.

9. The apparatus of claim 1, wherein the reference value comprises the statistical value for one of the plurality of A-D converters other than the at least one of the plurality of A-D converters.

10. The apparatus of claim 9, wherein the reference value comprises the maximum statistical value from the statistical values associated with the plurality of A-D converters.

11. The apparatus of claim 1, wherein the reference value is predetermined.

12. The apparatus of claim 1, wherein, to apply the offset value, the correction module is further configured to normalize a value of the digital sample using the offset value.

13. The apparatus of claim 1, wherein, to determine the offset value, the correction module is further configured to calculate a difference of the statistical sample value associated with the at least one of the plurality of A-D converters and the reference value.

14. The apparatus of claim 1, wherein the number of samples in the set of digital samples is dynamically configurable.

15. The apparatus of claim 1, wherein the number of samples in the set of digital samples is predetermined, constant, or both.

16. The apparatus of claim 1, wherein the set of digital samples is updated by adding one or more new digital samples to the set, and removing as many existing samples from the set as the number of new digital samples.

17. A method comprising:
  generating, using a processor, a statistical sample value for each of a plurality of analog-to-digital (A-D) converters using a set of digital samples received therefrom;
  for at least one of the plurality of A-D converters:
  determining, using the processor, an offset value comprising comparing the statistical sample value associated with the at least one of the plurality of A-D converters with a reference value; and
  applying, using the processor, the offset value to a digital sample received from the at least one of the plurality of A-D converters to generate a corrected digital sample.

18. The method of claim 17, wherein the statistical sample value comprises a mean sample value of the set of digital samples.

19. The method of claim 17, wherein the statistical sample value comprises a maximum sample value of the set of digital samples.

20. The method of claim 19, wherein the maximum sample value comprises a peak-to-peak maximum sample value.

21. The method of claim 17, further comprising time-interleaving the digital samples received from the plurality of A-D converters.

22. The method of claim 21, wherein the digital samples time-interleaved by the sample interleaver comprise the corrected digital sample corresponding to the at least one of the plurality of A-D converters.

23. The method of claim 17, wherein the reference value comprises the statistical value associated with one of the plurality of A-D converters other than the at least one of the plurality of A-D converters.

24. The method of claim 23, wherein the reference value comprises the maximum statistical value from the statistical values associated with the plurality of A-D converters.

25. The method of claim 17, wherein the reference value is predetermined.

26. The method of claim 17, wherein applying the offset value further comprises normalizing a value of the digital sample using the offset value.

27. The method of claim 17, wherein determining the offset value further comprises calculating a difference of the statistical sample value associated with the at least one of the plurality of A-D converters and the reference value.

28. A system comprising:
  a plurality of A-D converters, each A-D converter being configured to generate digital samples;
  a processing unit configured to:
  receive the digital samples from the plurality of analog-to-digital (A-D) converters,
  for each of the plurality of A-D converters, generate a statistical sample value using a set of digital samples from the digital samples received from that A-D converter, and
  for at least one of the plurality of A-D converters,
    determine an offset value by comparing the statistical sample value for the at least one of the plurality of A-D converters with a reference value, and
    apply the offset value to a digital sample received from the at least one of the plurality of A-D converters to generate a corrected digital sample; and
  a sample interleaver configured to temporally interleave the digital samples received from the plurality of A-D converters.

29. The system of claim 28, wherein the statistical sample value comprises a mean sample value of the set of digital samples.

30. The system of claim 28, wherein the statistical sample value comprises a peak-to-peak maximum sample value of the set of digital samples.

31. The system of claim 28, wherein the reference value comprises the statistical value for one of the plurality of A-D converters other than the at least one of the plurality of A-D converters.

32. The system of claim 31, wherein the reference value comprises the maximum statistical value from the statistical values associated with the plurality of A-D converters.

33. The system of claim 28, wherein, to determine the offset value, the processing unit is further configured to calculate a difference of the statistical sample value associated with the at least one of the plurality of A-D converters and the reference value.

* * * * *